(12) United States Patent
Mopidevi et al.

(10) Patent No.: US 10,460,914 B2
(45) Date of Patent: Oct. 29, 2019

(54) FERRITE CAGE RF ISOLATOR FOR POWER CIRCUITRY

(71) Applicant: Lam Research Corporation, Fremont, CA (US)

(72) Inventors: Hema Swaroop Mopidevi, Fremont, CA (US); John Pease, San Mateo, CA (US); Thomas W. Anderson, Hayward, CA (US); Neil M. P. Benjamin, Palo Alto, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 131 days.

(21) Appl. No.: 15/828,258

(22) Filed: Nov. 30, 2017

(65) Prior Publication Data

US 2019/0164729 A1  May 30, 2019

(51) Int. Cl.
| | | |
|---|---|---|
| *H01J 37/32* | (2006.01) | |
| *H01L 21/67* | (2006.01) | |
| *H02J 50/12* | (2016.01) | |
| *H01L 21/683* | (2006.01) | |

(52) U.S. Cl.
CPC .. *H01J 37/32651* (2013.01); *H01J 37/32082* (2013.01); *H01J 37/32174* (2013.01); *H01L 21/67103* (2013.01); *H01L 21/6833* (2013.01); *H02J 50/12* (2016.02); *H01J 2237/0266* (2013.01)

(58) Field of Classification Search
CPC ........... H01J 37/32651; H01J 37/32082; H01J 37/32174; H01J 2237/0266; H01L 21/67103; H01L 21/6833
See application file for complete search history.

(56) References Cited

U.S. PATENT DOCUMENTS

| | | |
|---|---|---|
| 5,015,972 A | 5/1991 | Cygan et al. |
| 5,032,808 A | 7/1991 | Reddy |
| 5,622,635 A | 4/1997 | Cuomo et al. |
| 5,650,032 A | 7/1997 | Keller et al. |
| 5,805,042 A | 9/1998 | Chastain et al. |
| 5,811,022 A | 9/1998 | Savas et al. |
| 6,447,636 B1 | 9/2002 | Qian et al. |
| 6,873,112 B2 | 3/2005 | Wilcoxson et al. |
| 8,755,204 B2 | 6/2014 | Benjamin |

(Continued)

OTHER PUBLICATIONS

Orfanidis, Sophocles J., "Electromagnetic Waves and Antennas," Chapter 15, "Radiation Fields," pp. 709-738. Latest revision posted Aug. 1, 2016.

(Continued)

*Primary Examiner* — Robert L Deberadinis

(57) ABSTRACT

RF isolation for power circuitry includes one or more ferrite cages surrounding a pair of coils, one coil connected to power input, and the other coil connected to a load such as a heater. The ferrite cage provides universal isolation for the coils, avoiding the necessity of specially tuned filters or more complicated coil arrangements. A pair of dielectric discs support respective coils. In one aspect, the ferrite cage is constituted by ferrite pieces which fan out from a central portion of the dielectric discs and are connected at an outer periphery of the dielectric discs, and at the central portion of the dielectric discs. In one aspect, the fanned-out ferrite pieces comprises either manganese-zinc or magnesium-zinc ferrites, and the ferrite pieces connecting the fanned-out ferrite pieces comprise nickel-zinc ferrites.

23 Claims, 6 Drawing Sheets

(56) References Cited

U.S. PATENT DOCUMENTS

| | | |
|---|---|---|
| 2005/0103444 A1 | 5/2005 | Brcka |
| 2011/0092072 A1 | 4/2011 | Singh et al. |
| 2014/0097752 A1 | 4/2014 | Biloui et al. |
| 2016/0198524 A1 | 7/2016 | Pease et al. |
| 2017/0032935 A1 | 2/2017 | Benjamin et al. |
| 2017/0040148 A1 | 2/2017 | Augustino et al. |
| 2017/0053782 A1 | 2/2017 | O'Neill et al. |

OTHER PUBLICATIONS

Van Den Bossche, Alex, et al., "Measurement and Loss Model of Ferrites with Non-sinusoidal Waveforms," 35th Annual IEEE Power Electronics Specialists Conference, Aachen, Germany, 2004, pp. 4814-4818. Conference held Jun. 20-25, 2004; proceedings added to IEEE Xplore Nov. 15, 2004.

FERRITE CAGE RF ISOLATOR FOR POWER CIRCUITRY

FIELD

The present disclosure relates to substrate processing systems, more particularly to electrostatic chucks for substrate processing systems, and yet more particularly to heating systems for electrostatic chucks in substrate processing systems. Still more particularly, the present disclosure relates to RF isolation for power circuitry used in heaters for electrostatic chucks in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching and/or other treatment of substrates such as semiconductor wafers. A substrate may be arranged on an electrostatic chuck (ESC), or on a pedestal attached to an ESC, in a processing chamber of the substrate processing system. The ESC may be biased with an RF signal, using RF voltages in the range from tens to thousands of volts and RF frequencies in the range from tens of kHz to hundreds of MHz. Since the ESC also acts as a workpiece holder, proper control of the ESC temperature is an important consideration to ensure repeatable process results.

One or more electric heaters may maintain the ESC's temperature within a desired range. The heaters may be integrated or coupled with the ESC. Electrical power to the heater(s) typically is obtained from line AC voltage via an appropriate control circuit to maintain the ESC within a desired temperature range. By way of example, the electric heater(s) may be powered by DC, line frequency (e.g., 50/60 Hz AC) or kHz range AC power. The heaters may be operated at the same time, or at different times, depending on process requirements, chamber conditions, and the like, to maintain a temperature profile of the process. Maintaining the temperature profile facilitates better uniformity and etch rates in substrate processing.

In this configuration, the DC/low frequency power needs to be coupled to the ESC assembly, which is also simultaneously subject to substantial levels of RF power either by stray coupling or by direct connection. To prevent an undesirable apparent RF short to ground, loss of RF power and high levels of signal interference, even damage via the electric heater power supply and/or control circuitry, RF isolation is required.

Separate filters have been designed to block the RF current path from the heaters to their power source on different tools depending on RF-rejection frequency requirements. Designing RF filters has been tedious because, among other things, it has been necessary to place the parasitic resonances carefully between the harmonic frequencies to avoid unintentional RF-current. In addition, RF-rejection requirements have changed repeatedly as etch-rate and uniformity requirements have changed. Etch rates and uniformity requirements continue to change, so RF-rejection requirements may be expected to undergo continued change as well.

As a result, in lieu of specific filters for specific requirements, a universal solution for RF isolation has been sought. One such solution has been to replace all the RF-filters by designing a broadband and high power RF isolator which filters frequencies by providing a capacitive rejection response.

U.S. Pat. No. 8,755,204 discloses an approach to providing RF isolation. The patent proposes to reduce secondary-to-core capacitive coupling by, for example, providing a shield between a secondary winding and a core of an isolation transformer. The patent also proposes to reduce primary-to-core capacitive coupling by, for example, providing a shield between a primary winding and the core.

FIG. 1 shows relevant portions of an isolation transformer implementation, according to the above-referenced patent, to provide high DC or AC line power to a load that is also coupled to one or more high frequency RF signals. In FIG. 1, the load is a heater for an RF coupled chuck in a plasma processing chamber. A source power signal in the form of AC line voltages and frequencies (e.g., 50 Hz or 60 Hz) is supplied via leads 202 and 204 to a rectifier/filter circuit 206 which converts the AC line input power signal to a quasi-DC power signal which may be subsequently filtered into smooth DC if desired.

The DC power signal output by rectifier circuit 206 is then supplied to a drive circuit 208, which converts the DC power signal received on leads 210 and 212 to an intermediate signal having an intermediate frequency, for example, in the range of about 10 kHz to about 1 MHz, or in the range of about 10 kHz to about a few hundred kHz, and or in the range of about 10 kHz to about 200 kHz. As a result, the intermediate frequency is intentionally higher than the AC line frequency of 50-60 Hz but lower than the RF frequency to be blocked (which tends to be in the multiple MHz range). Because the intermediate frequency is higher than the AC line frequency, it is possible to use a smaller isolation transformer 220.

The intermediate signal output by drive circuit 208 is then supplied to the primary winding 222 of isolation transformer 220. Primary winding 222 is shown wound around one segment of a core 224. Core 224 may be formed of manganese zinc (MnZn) or nickel zinc (NiZn) or another suitable high magnetic permeability material (e.g., mu in the 2000 range). An air gap 230 may be provided in core 224, in which case primary winding 222 may be wound to the sides of the air gap 230 instead of over air gap 230, in order to reduce dissipation in the winding.

Secondary winding 236, which is not directly coupled to primary winding 222 by conduction, is also wound around core 224. To reduce capacitive coupling between primary winding 222 and secondary winding 236 and provide a high degree of isolation, particularly for the higher frequency RF signals, secondary winding 236 may be positioned apart from primary winding 222. For example, secondary winding 236 may be positioned opposite primary winding 222 around core 224, as FIG. 1 shows.

In the approach just described, the core is machined in a U-shape and requires the following elements to decrease capacitive coupling of the secondary to core, and of the primary to the secondary: i) larger diameter secondary winding, possibly wound on a plastic cylinder—the inner diameter of which will be stuffed with ferrite; ii) primary and secondary windings placed physically apart from each other but still magnetically coupled through the same core.

There are some challenges with respect to this approach. First, the cost to machine a U-shaped ferrite block, large enough to separate the primary winding from the secondary winding, and plastic cylinders (with precise grooves on the outer surfaces and holes for cooling the ferrite inside) can be difficult from a system stand-point. Second, when the ferrite is stuffed into the plastic cylinder on which the secondary winding is wound, it can be challenging to design an efficient cooling mechanism.

It would be desirable to provide RF isolation that is more comprehensive, and that does not require specially tuned circuitry, or intricate and/or expensive assembly and/or manufacture.

SUMMARY

RF isolation for power circuitry in substrate processing systems includes a ferrite cage around coils which supply power. Proper construction of the ferrite cage can eliminate stray capacitances and provide the required RF isolation at a wide range of frequencies. The ferrite cage provides universal isolation for the coils, avoiding the necessity of specially tuned filters or more complicated coil arrangements. A pair of dielectric discs support respective coils. In one aspect, the ferrite cage is constituted by ferrite pieces which fan out from a central portion of the dielectric discs and are connected at an outer periphery of the dielectric discs, and at the central portion of the dielectric discs. In one aspect, the fanned-out ferrite pieces comprises either manganese-zinc or magnesium-zinc ferrites, and the ferrite pieces connecting the fanned-out ferrite pieces comprise nickel-zinc ferrites.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 2:
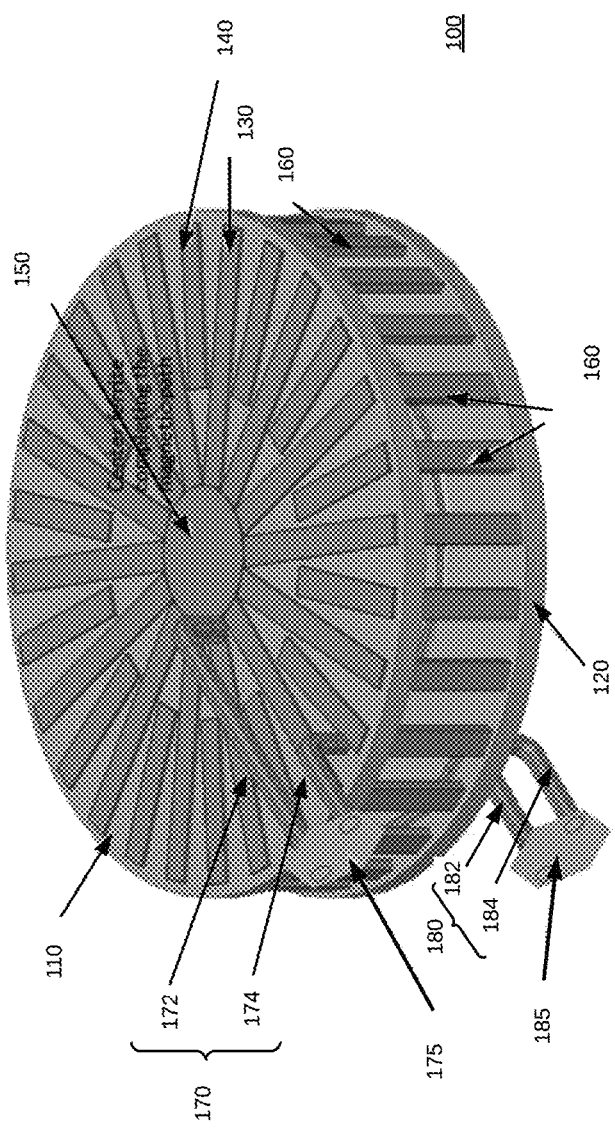
FIG. 2 is a plan view of an RF isolation apparatus according to one aspect of the present disclosure.

FIG. 2 shows an RF isolation apparatus according to an aspect of the present disclosure. In one aspect, the apparatus is a ferrite cage 100. In FIG. 2, ferrite cage 100 includes upper and lower dielectric discs 110, 120, which have respective coils 170, 180 disposed therein, as will be discussed in more detail below. In the following discussion, coil 170 is a primary winding that draws power from a power source, and coil 180 is a secondary winding that delivers energy to a load. In one aspect, the load is constituted by heaters for an ESC. For ease of description, coil 170 will be referred to as a primary and coil 180 will be referred to as a secondary.

The ferrite cage 100 also includes ferrite pieces 130, 140, 150, and 160. In order to form the ferrite cage 100, the ferrite pieces 130, 140, 150, and 160 are connected to each other, as will be explained, in order to complete a magnetic path. In one aspect, the ferrite pieces 130, 140, and 150 are glued to the outer surfaces of upper and lower dielectric discs 110, 120. FIG. 2 also shows ferrite pieces 130, 140 contacting each other, with the ferrite pieces 130, 140 alternating around the circumference of disc-shaped ferrite piece 150, and the ferrite pieces 130 contacting disc-shaped ferrite piece 150. In one aspect, ferrite pieces 130, 140 may contact disc-shaped ferrite piece 150, but not each other. In another aspect, ferrite pieces 130, 140 may contact each other, but only ferrite pieces 130 or 140 contact disc-shaped ferrite piece 150. FIG. 2 shows ferrite pieces 130, but not ferrite pieces 140, contacting disc-shaped ferrite piece 150.

In FIG. 2, ferrite pieces 130, 140 are disposed on an outer surface of upper and lower dielectric discs 110, 120. As mentioned previously, primary coil 170 and secondary coil 180 are disposed within respective dielectric discs 110, 120. In one aspect, primary coil 170 and secondary coil 180 may be attached on an opposite side respective dielectric discs 110, 120 from ferrite pieces 130, 140, and 150, so that the primary coil 170 and secondary coil 180 are inside the ferrite cage 100. Another such disc-shaped ferrite piece 150 is disposed in the center of the outer surface of lower disc 120. The ferrite pieces 130 extend from ferrite piece 150 toward outer edges of dielectric discs 110, 120. In one aspect, the ferrite pieces 130, 140 extend all the way to the outer edges of dielectric discs 110, 120, to facilitate contact with ferrite pieces 160 and complete the magnetic path. How the ferrite pieces 130, 140 contact ferrite pieces 160 will be described further below. However, the ferrite pieces 130, 140 do not need to extend all the way to the outer edges of upper and lower dielectric discs 110, 120 in order to contact ferrite pieces 160 and complete the magnetic path. What it is necessary is that the primary coil 170 and secondary coil 180 be inside the ferrite cage 100.

In one aspect, the arrangement resembles a flower, with bar-shaped ferrite pieces 130 extending radially from disc-shaped ferrite piece 150. Another way of describing the arrangement of these pieces is a hub-and-spoke configuration, with disc-shaped ferrite piece 150 being the hub and ferrite pieces 130 being the spokes.

Depending on operational requirements, the disc-shaped ferrite piece 150 may have a radius as shown in FIG. 2, relative to a radius of the dielectric discs 110, 120 and/or of the overall ferrite cage 100. However, FIG. 2 is not necessarily to scale, and disc-shaped ferrite piece 150 may have a different radius, again depending on operational requirements. As noted earlier, FIG. 2 shows inwardly extending ferrite pieces 130, but not ferrite pieces 140, contacting disc-shaped ferrite piece 150, to complete the magnetic path. In one aspect, the same arrangement is provided on an outer surface of upper disc 110 as on an outer surface of lower disc 120.

FIG. 2 shows ferrite pieces 140 disposed between adjacent ferrite pieces 130, filling some of the gaps between the adjacent ferrite pieces 130. Depending on widths of the ferrite pieces 130, ferrite pieces 140 may be wider or narrower than ferrite pieces 130, or equal in length to or shorter than ferrite pieces 130. FIG. 2 shows the ferrite pieces 140 being shorter than ferrite pieces 130, and also shows the ferrite pieces 130, 140 as rectangular or bar-shaped, with similar widths. Machining the ferrite pieces 130, 140 can be easier if the shapes are similar to each other, particularly if the ferrite pieces 130, 140 are rectangular or bar-shaped. In one aspect, the ferrite pieces 130 have shapes that differ from those of ferrite pieces 140.

In one aspect, the ferrite pieces 130 may have a shape which is narrower toward a center of dielectric discs 110, 120, and wider toward an outer diameter of dielectric discs 110, 120. In the resulting arrangement, ferrite pieces 130 may have arcuate-shaped segments, or pie-shaped segments, or segments with a shape not dissimilar to flower petals. In one aspect, with the ferrite pieces 130 having such non-rectangular shapes, ferrite pieces 140 may not be required, as the ferrite pieces 130 themselves may cover a sufficient amount of area without needing the ferrite pieces 140 to "fill in" gaps. In another aspect, in some applications, even if ferrite pieces 130 have the rectangular or bar shapes described above, ferrite pieces 140 may not be necessary in order to complete the ferrite cage 100 appropriately. The number and size of gaps in the ferrite cage 100 will depend on the frequency range being addressed, and on the stray capacitances that can result.

The ferrite pieces 130, 140 on upper and lower dielectric discs 110, 120 are connected by further ferrite pieces 160. One ferrite piece 160 connects a ferrite piece 130 or 140 on disc 110 to a respective ferrite piece 130 or 140 on disc 120. In one aspect, one or more ferrite pieces 130 on one of the dielectric discs 110, 120 may be connected to ferrite pieces 140 on the other one of the dielectric discs. That is, it is not necessary that the same respective pieces on the upper and lower dielectric discs 110, 120 be connected to each other. The main point is to complete the magnetic path appropriately so that the ferrite cage 100 functions as intended, to eliminate stray capacitances and provide the desired RF isolation over a range of frequencies.

In order to complete the magnetic path, as FIG. 2 illustrates, in one aspect the ferrite pieces 160 extend through upper and lower dielectric discs 110, 120 so as to contact ferrite pieces 130, 140 on both of the upper and lower dielectric discs 110, 120. In this aspect, ferrite pieces 130, 140 need not extend all the way to a circumference of upper and lower dielectric discs 110, 120. It is desirable that the pieces 160 to be sufficiently inside the outer edge of the dielectric discs 110, 120 to provide appropriate structural integrity for the dielectric discs, and for the overall ferrite cage 100.

In one aspect, the ferrite pieces 160 may be glued around a circumference of upper and lower dielectric discs 110, 120 in order to complete the magnetic path. In this aspect, in order to complete the magnetic path, ferrite pieces 130, 140 extend all the way to a circumference of upper and lower dielectric discs 110, 120.

One advantage of using ferrite pieces instead of a solid piece of ferrite is ease and cost of fabrication. Assembling ferrite pieces 130, 140, 150, and 160 into a ferrite cage 100 such as the one shown in FIG. 2 generally is an easier process than machining blocks of ferrite into a suitable shape. Another advantage is that capacitance is reduced.

In one aspect, a diameter of the upper and lower dielectric discs 110, 120 will have a relationship to a diameter of primary coil 170 and secondary coil 180. The primary coil 170 and secondary coil 180 will fit within the ferrite cage 100, and will have a size that is a function of power transfer requirements. In one aspect, upper and lower dielectric discs 110, 120 have a diameter of approximately 170-200 mm.

Figure 3:
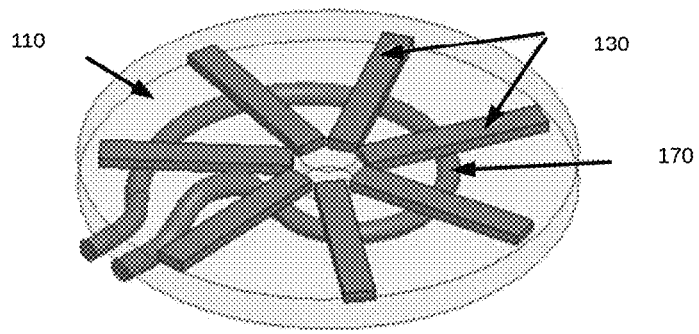
FIG. 3 is a plan view of a top portion of an RF isolation apparatus according to one aspect of the present disclosure.

FIG. 3 shows more interior detail of the arrangement of ferrite pieces 130 and primary coil 170, with upper disc 110 being shown in slightly transparent form so as to make primary coil 170 more visible. In one aspect, as noted earlier, primary coil 170 is disposed inside upper disc 110. In FIG. 3, ferrite pieces 130 are bar-shaped, and extend radially from a central portion of upper disc 110. In one aspect, edges or corners of the ferrite pieces 130 contact each other toward a center of upper disc 110, as part of the completion of the magnetic path. The disc-shaped ferrite piece 150 in FIG. 2 is not depicted here, but in one aspect, that ferrite piece 150 would be arranged similarly to the arrangement in FIG. 2, in order to complete the magnetic path. That disc-shaped ferrite piece 150 would contact not just the ferrite pieces 130, but also the ferrite pieces 140, in order to complete the magnetic path.

Figure 4:
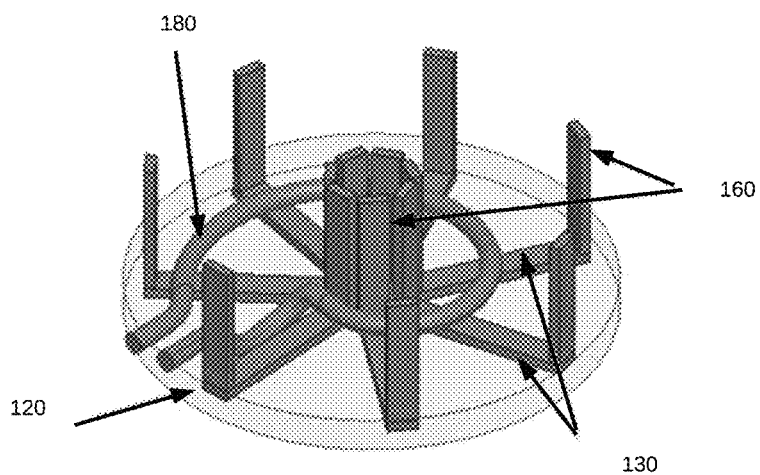
FIG. 4 is a plan view of a bottom portion of an RF isolation apparatus according to one aspect of the present disclosure.

FIG. 4 shows more interior detail of the arrangement of ferrite pieces 130, 160 and secondary coil 180, with lower disc 120 being shown in slightly transparent form so as to make secondary coil 180 and ferrite pieces 130 more visible. In one aspect, as noted earlier, secondary coil 180 is disposed inside lower disc 110. In FIG. 4, ferrite pieces 130 are bar-shaped, and extend radially from a central portion of lower disc 120. Ferrite pieces 160 extend upwardly from ferrite pieces 130, not only at an outer radius of lower disc 120, but also upwardly from ferrite pieces 130 toward a center of the lower disc 120.

One aspect that appears differently in FIG. 4 from FIG. 2 is that in FIG. 4, for ease of illustration, there are only as many vertical ferrite pieces 160 shown as there are ferrite pieces 130. In FIG. 2, there are as many vertical ferrite pieces 160 at or around the circumference of dielectric discs 110, 120 as there are ferrite pieces 130, 140, so as to complete the magnetic path.

In one aspect, upper and lower dielectric discs 110, 120 are formed of a dielectric material such as a polyetherimide (PEI) resin. Examples of such resins, particularly amorphous thermoplastic PEI resins, are found in the ULTEM™ family of resins. Other suitable materials can include polyetheretherketone (PEEK), polytetrafluoroethylene (PTFE), and fiberglass, including G7 and G10 versions of fiberglass.

In one aspect, the upper and lower dielectric discs 110, 120 are solid. In another aspect, they are solid except for slots formed for the ferrite pieces 160 to extend therethrough. In one aspect, one or both of the dielectric discs 110, 120 have air holes to provide laminar air flow without affecting the RF isolation properties of the ferrite cage 100.

In one aspect, the ferrite pieces 160 are nickel-zinc (NiZn) ferrites. In one aspect, the ferrite pieces 130, 140 on the upper surface of disc 110 and the lower surface of disc 120 are manganese-zinc (MnZn) ferrites or magnesium-zinc (MgZn) ferrites. In one aspect, the central circular portion 150 on the upper surface of disc 110 and the lower surface of disc 120 comprises a NiZn ferrite, though it also may comprise a MgZn ferrite. Other ferrite materials may be used, depending on such considerations as frequency. Examples of such ferrites include nickel-magnesium (NiMg) ferrites. Generally, permeability of ferrite materials is not linear with frequency. Some ferrite materials have such high permeability as to appear almost like conductors at certain frequencies such as power frequencies.

In one aspect, NiZn may be more appropriate for certain portions of the ferrite cage from the standpoint of frequency dependent permeability, permittivity, and loss characteristics. In this aspect, NiZn ferrites have relatively low permittivity, yielding better isolation between the AC and RF ports. Higher magnetic permeability material can be more advantageous in containing magnetic fields. However, that material also may have a higher dielectric constant, thereby decreasing the isolation between the AC and RF ports. MnZn would be an example of such material. In one aspect, some of the material may be NiZn and some may be MnZn. For example, ferrite pieces 130, 140 (perhaps also ferrite pieces 150—overall, the horizontal pieces) may be MnZn ferrites, and ferrite pieces 160 (the vertical pieces) may be NiZn ferrites. In one aspect, MgZn ferrites in addition to or as an alternative to MnZn ferrites, along with NiZn ferrites, may be advantageous in increasing magnetic coupling between the primary coil 170 and the secondary coil 180 without degrading their capacitive isolation significantly.

In one aspect, at higher frequencies, such as frequencies in the range of tens or hundreds of MHz, bars made of ferrites or metal dust are preferred. At frequencies for power transmission, in one aspect 100 kHz to 1 MHz, ferrites such as NiMg or MgZn ferrites, or NiZn ferrites are used. In addition, while ferrites have been the focus of the description and discussion herein, ferrous or ferromagnetic materials, such as powdered irons and steel bars, are classes of materials that may be considered for the ferrite cage 100.

Referring again to FIG. 2, primary coil 170 and secondary coil 180 are disposed within the ferrite cage 100, and in particular, within respective upper and lower dielectric discs 110, 120. In one aspect, the primary coil 170 and secondary coil 180 are planar or pancake coils. In various aspects, the pancake coil configuration could have more than one layer, or could use a printed circuit board (PCB) on either the transmitting end or the receiving end. The primary coil 170 and secondary coil 180 are appropriately spaced from each other to permit suitable coupling for power generation (in one aspect, 10-15 kW). Monitoring the amount of current on the primary side will enable monitoring of power going out on the secondary side.

This planar or pancake coil configuration does not rely on magnetic material for flux coupling. This approach also avoids saturation because there is no magnetic material to saturate. The ferrite cage 100 helps to focus the flux between the primary coil 170 and secondary coil 180.

Notwithstanding the foregoing, the flux coupling achieved may not be optimal. In order to compensate appropriately, either or both of the primary and the secondary side may be resonated in order to tune the system to the operating frequency. This resonating transfers power efficiently, even with loss of flux. Active tuning circuits may be used to track the resonance.

The coil arrangement as shown herein provides better RF isolation compared to the coil arrangement shown in the above-referenced US patent. To the extent there is any tradeoff in flux coupling efficiency, the overall power transfer efficiency of this arrangement is attractive, as will be discussed below. Connector 175 receives opposing ends 172, 174 of primary coil 170. Connector 185 receives opposing ends 182, 184 of coil 180.

Figure 1:
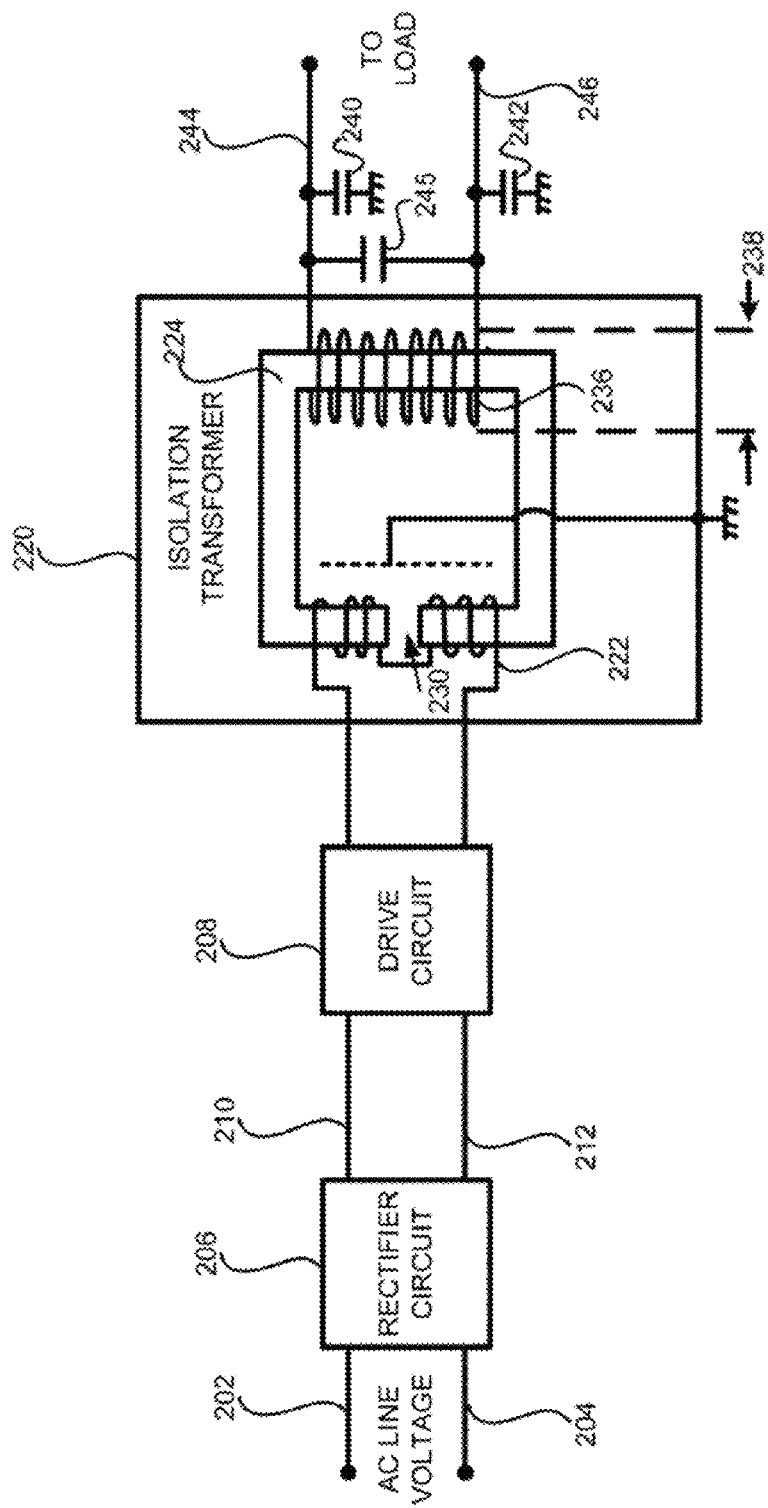
FIG. 1 is a diagram of an RF isolation approach.

The primary coil 170 will be connected, for example, to an RF power supply, for which the input could be DC, or could be AC at any of a number of frequencies, and converted through appropriate rectifier and other circuitry to power at an appropriate frequency to be supplied to the primary. The secondary coil 180 will be connected to a load, for example, a heater for an ESC. The ESC may employ multiple heaters, each heater heating a particular zone of the ESC, depending on, among other things, substrate processing requirements and conditions within the substrate processing chamber. The above-mentioned U.S. Pat. No. 8,755,204 provides examples of rectifier and drive circuitry arrangements connected to a primary as shown in FIG. 1. In that Figure, in one aspect, rectifier circuit 206 is a bridge rectifier and/or may employ triac, SSR, or thyristor controls. Rectifier circuit 206 converts the AC line input power signal to a quasi-DC power signal which may be subsequently filtered into smooth DC if desired. In FIG. 1, the AC source power signal on leads 202/204 may be a single phase signal or a 3-phase signal as desired, and rectifier circuit 206 is correspondingly a single-phase or three-phase rectifier. If a DC power signal is available as input power, then no rectification may be necessary. If high current is drawn from the AC line into the input filter, power factor correction circuitry may be required. In one or more aspects, drive circuit 208 is a switch-mode power supply, which pulse-width modulates the received DC power signal to the desired intermediate frequency. In one or more embodiments, the duty cycle after pulse-width modulation may vary from slightly above zero to about 50%. If desired, an appropriate drive circuit 208 may modulate the received DC power signal to an AC sine signal having an intermediate frequency. Reducing the harmonic content in this fashion can prevent interference and noise issues and simplifies any filtering requirements. Alternate power modulation schemes including zero crossing and on/off control may also be implemented either solo, or in combination.

In one or more aspects, filters may be employed to allow the high frequency RF signal (i.e., the RF signal to be blocked) to be presented to isolation transformer 220 as a common mode signal. Looking back again at FIG. 1, capacitor 245 is coupled to leads 244 and 246 respectively to accomplish the goal of presenting the high frequency RF signal to isolation transformer 220 as a common mode signal. Filters of other designs well known to those skilled in the art may also be employed. FIG. 1 shows stray capacitances, represented by capacitors 240 and 242. In U.S. Pat. No. 8,755,204, these stray capacitances may be dominated by capacitor 245 for the purpose of insuring that the output signal RF coupling is a common mode signal. However, the RF isolation that the ferrite cage 100 according to aspects of the present disclosure provides avoids stray capacitances. As a result, if capacitor 245 is provided in order to present a common mode signal, avoiding resonating at critical frequencies would be the key criterion.

Once the power is transferred across the RF isolation, it can be used to power a passive circuit such as a heater directly, either as AC at the switching frequency, or rectified into deeply modulated DC or filtered back to smoothed DC. It may also be rectified or controlled at the high side if desired.

In one aspect, where the coil geometry is configured to choke certain frequencies, for example, in a range from 400 kHz to 30 MHz, a single ferrite cage 100 may be sufficient to contain stray fields that the coils 170, 180 may produce. For coil geometries configured to choke still higher frequencies, for example in a range from 400 kHz to 80 MHz, concentric ferrite cages 100 may be used to provide better isolation and capture more of the stray magnetic fields that coils 170, 180 can produce. The concentric ferrite cages can choke RF frequencies over an even larger range, from 400 kHz to 300 MHz.

In one aspect, ferrite pieces 140 are located at intervals between adjacent ferrite pieces 130. In another aspect, still more such ferrite pieces can be located at different intervals between adjacent ferrite pieces 130, 140, to capture those stray fields. In still another aspect, the arrangement of ferrite material on upper and lower dielectric discs 110, 120 can be of various designs, including for example a spiral or helical design, resulting in a ferrite cage that is more spiral in shape than cylindrical, while still containing primary coil 170 and secondary coil 180.

Manufacturing planar parts such as dielectric discs 110, 120 tends to be easier than manufacturing cylindrical parts such as are used in the above-referenced US patent. In addition, providing holes for laminar airflow tends to be easier with planar parts than with cylindrical parts. As a result, there can be sufficient air gaps for the ferrite in ferrite cage 100 to cool, providing a stable design. Taken with the relative ease of machining ferrite bars separately rather than making a ferrite cage out of a ferrite block, overall it is easier to manufacture a ferrite cage 100 in accordance with aspects described herein.

Another advantage of the planar approach versus the cylindrical approach for the dielectric materials is that core saturation will be at a minimum. In addition, with permittivity of the ferrite material in ferrite cage 100 in the range 10-1000 according to one aspect, turn-to-turn parasitic coupling is considerably reduced in the planar approach versus the cylindrical approach.

In addition, according to one aspect, ferrite loss enables dampening of unwanted resonances above 100 MHz, without requiring separate dampening elements such as dampening resistors.

Still further, placing primary coil 170 and secondary coil 180 in ferrite cage 100 provides a strong magnetic path between the primary coil 170 and secondary coil 180. Magnetic coupling between the primary coil 170 and secondary coil 180 is increased significantly without degrading capacitive isolation between them. As a result, efficiency is substantially independent of load variations. In other approaches, efficiency drops off dramatically as load increases. In operation, there will be periodic increased load, and therefore substantial load variations, as heating elements are turned on and off.

Figure 5:
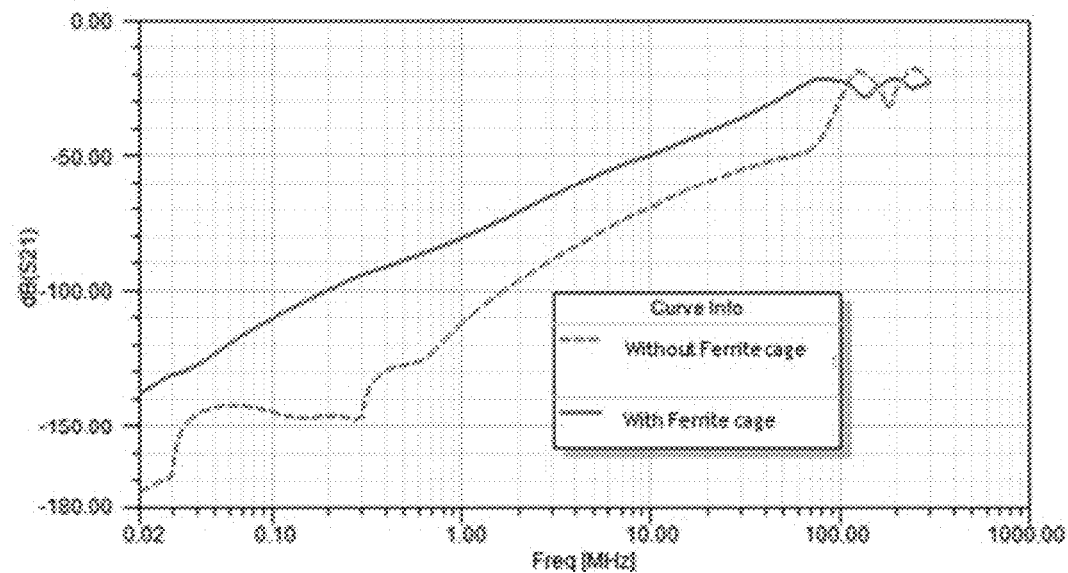
FIG. 5 is a graph showing RF isolation effects of an RF isolation apparatus according to one aspect of the present disclosure.

FIG. 5 is a graph of RF isolation in dB(S21) versus frequency (in MHz) for designs with and without the ferrite cage. dB(S21) signifies the power received at Port 2 relative to the power input at Port 1. The following table shows the corresponding difference in efficiency of the design including a ferrite cage according to one aspect, as compared to the efficiency of the design without a ferrite cage, at different loads.

| Load | Efficiency of Design with Ferrite Cage | Efficiency of Design without Ferrite Cage |
| --- | --- | --- |
| 1 Ω | 99.3% | 83% |
| 10 Ω | 98.74% | 43% |
| 50 Ω | 94.33% | 13.5% |
| 75 Ω | 91.78% | 9.3% |

With the ferrite cage design described herein, power supply efficiency is better than 90% over a wide range of loads (for example, when multiple heaters are operating at the same time).

According to one aspect, another advantage of the structures and techniques described herein is that, because the coils are not wound around a ferrite bar, as is the case in the above-mentioned US patent, core saturation is reduced, as is turn-to-turn capacitive coupling (which can cause unwanted parasitic resonances).

As an example of the reduction in capacitive coupling, it has been determined that, in the design employing a ferrite cage 100 as described above, a larger distance between coils (115.4 mm), with only 2.29 pF capacitance between the coils, yields a k-factor (magnetic coupling) of 0.29. In contrast, in order to achieve the same degree of magnetic coupling (k factor of 0.3), the coils must be much closer together (35.4 mm), yielding a much higher capacitance (10.7 pF).

Figure 6:
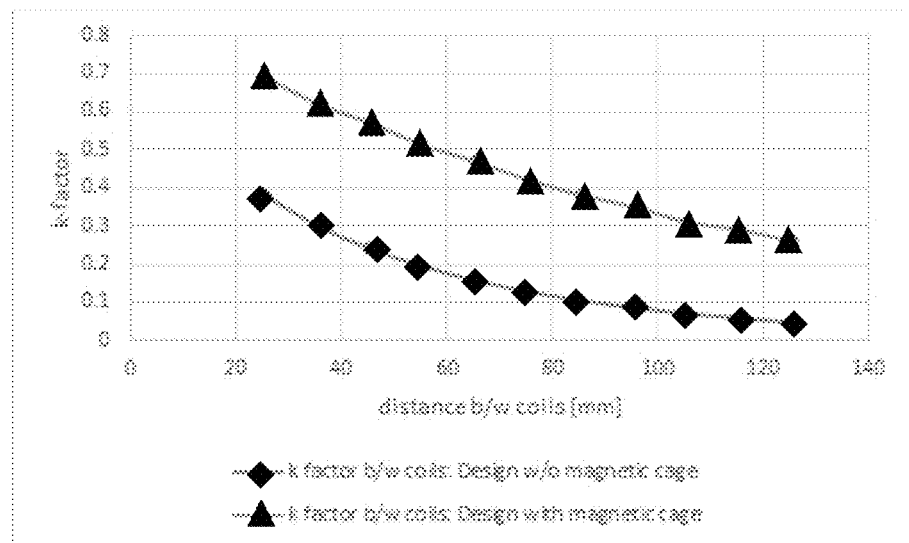
FIG. 6 is a graph showing magnetic coupling as a function of coil separation.

FIG. 6 is a graph that shows the difference in k-factor between a design without a ferrite cage 100 and with a ferrite cage 100. Consistent with the results discussed above, with a ferrite cage 100 according to aspects of the present disclosure, substantial magnetic coupling is achieved even with significant separation between coils 170, 180. That greater separation results in decreased capacitance between the coils 170, 180.

Figure 7:
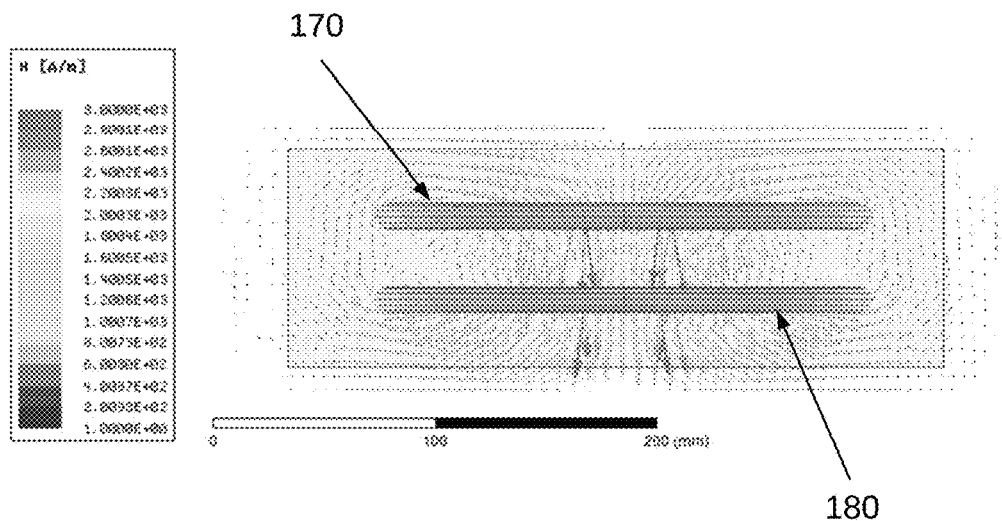
FIG. 7 depicts field lines for coils without a surrounding ferrite cage.
Figure 8:
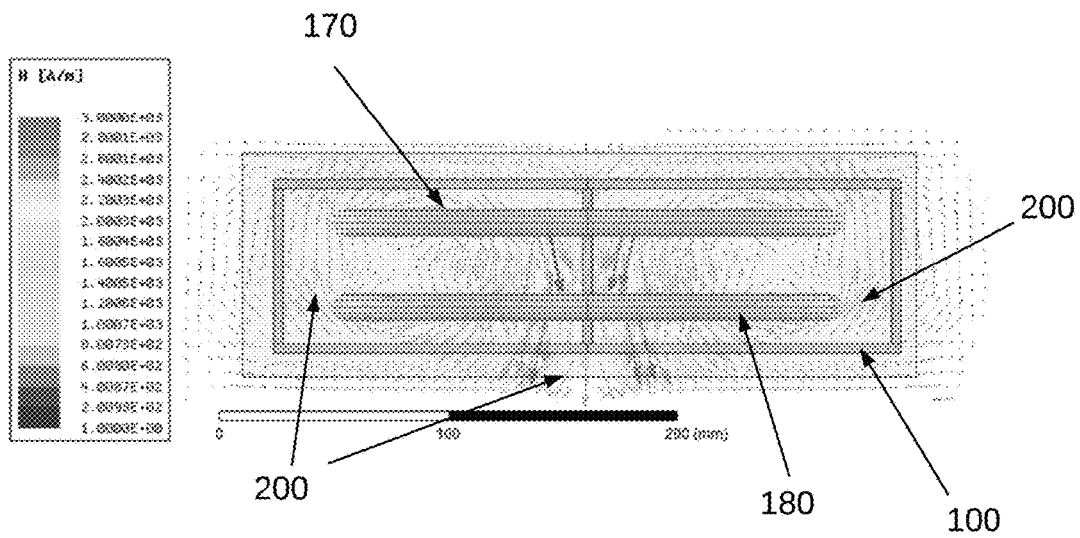
FIG. 8 depicts field lines for coils with a surrounding ferrite cage, with the same coil separation as in FIG. 7.

FIG. 7 depicts field strength lines (in terms of amperes/meter) for coils 170, 180 without a ferrite cage 100 surrounding them. FIG. 8 depicts field strength lines (in terms of amperes/meter) for coils 170, 180 with a ferrite cage 100 surrounding them. Comparing the field strength lines in FIGS. 7 and 8, it should be noted that FIG. 8 contains field strength lines 200 which represent guided magnetic field vectors, whereas FIG. 7 does not. Provision of the ferrite cage 100 around coils 170, 180 results in the guided magnetic field vectors 200.

Figure 9:
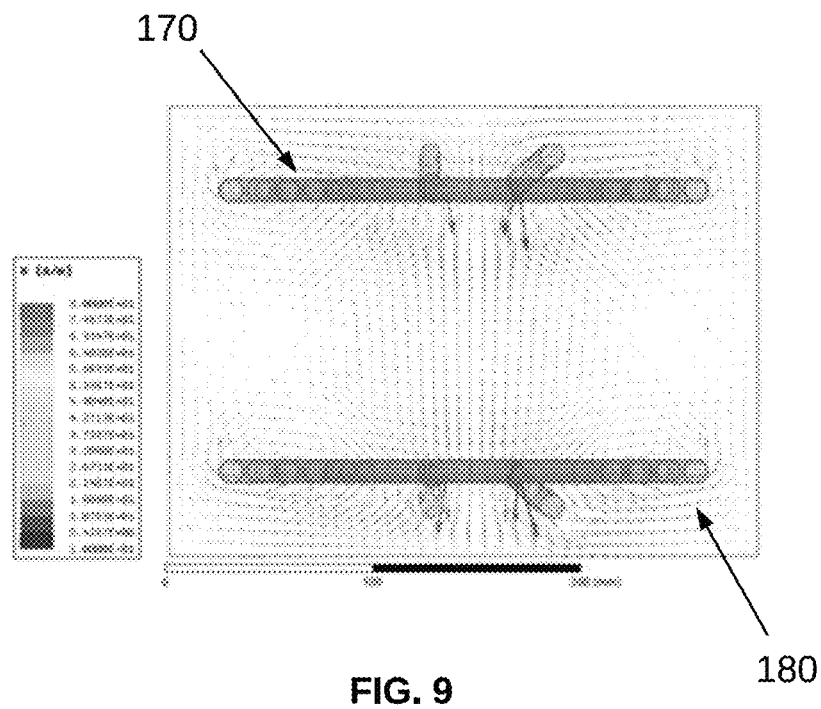
FIG. 9 depicts field lines for coils without a surrounding ferrite cage, with greater coil separation.
Figure 10:
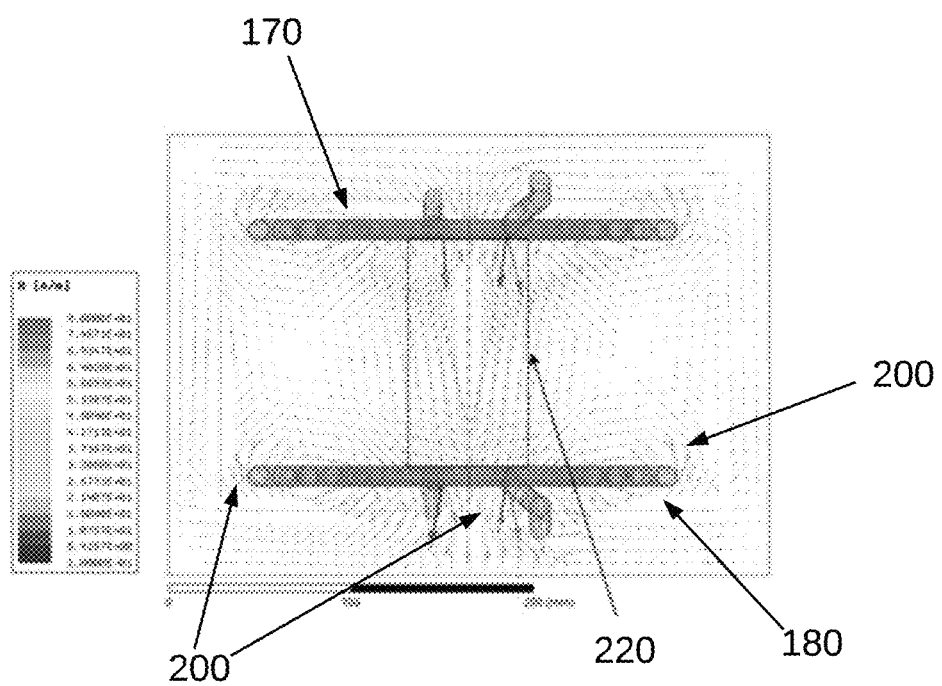
FIG. 10 depicts field lines for coils with a surrounding ferrite cage, with the same coil separation as in FIG. 9.

FIG. 9 depicts field strength lines (in terms of amperes/meter) for coils 170, 180 without a ferrite cage 100 surrounding them. FIG. 10 depicts field strength lines (in terms of amperes/meter) for coils 170, 180 with a ferrite cage 100 surrounding them. Comparing the field strength lines in FIGS. 9 and 10, it should be noted that FIG. 10 contains field strength lines 200 which represent guided magnetic field vectors, whereas FIG. 9 does not. Provision of the ferrite cage 100 around coils 170, 180 results in the guided magnetic field vectors 200.

FIGS. 6, 8, and 10 reflect provision of a ferrite cage 100 with ferrite pieces 130, 140, and 150 comprised of MnZn ferrites, and ferrite pieces 160 comprised of NiZn ferrites.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

Some implementations may be part of a substrate processing system. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. Etching may include conductor etch or dielectric etch.

What is claimed is:

1. Apparatus for providing isolated power to a component of a plasma processing chamber that also is subject to a plurality of RF signals, the plurality of RF signals including at least a first RF signal having a first RF frequency, the apparatus comprising:
    first and second coils; and
    a ferrite cage that surrounds said first and second coils, said ferrite cage comprising:
        a first dielectric disc supporting said first coil;
        a second dielectric disc supporting said second coil;
        first and second pluralities of ferrite pieces disposed on a side of said first dielectric disc facing away from said second dielectric disc;
        third and fourth pluralities of ferrite pieces disposed on a side of said second dielectric disc facing away from said first dielectric disc;
        the first through fourth pluralities of ferrite pieces being arranged such that the first and second dielectric discs and the first and second coils are inside the first through fourth pluralities of ferrite pieces;
        a fifth plurality of ferrite pieces to connect respective ones of the first and second pluralities of ferrite pieces to the third and fourth pluralities of ferrite pieces;
        said fifth plurality of ferrite pieces to separate said first and second dielectric discs so that the first and second coils are spaced apart by a predetermined distance; and
        said first coil to receive an input voltage signal and said second coil to provide an isolated power signal.

2. The apparatus of claim 1 wherein
    the first and second pluralities of ferrite pieces have the same size and shape, and
    the third and fourth pluralities of ferrite pieces have the same size and shape.

3. The apparatus of claim 1 wherein
    each of the second plurality of ferrite pieces is disposed respectively between adjacent ones of the first plurality of ferrite pieces, and each of the second plurality of ferrite pieces is shorter than each of the first plurality of ferrite pieces; and
    each of the fourth plurality of ferrite pieces is disposed respectively between adjacent ones of the third plurality of ferrite pieces, and each of the fourth plurality of ferrite pieces is shorter than each of the third plurality of ferrite pieces.

4. The apparatus of claim 3 wherein
    the first and second pluralities of ferrite pieces are rectangularly shaped, and are arranged on said first dielectric disc so as to fan out radially from a center of said first dielectric disc toward an outer periphery thereof, and
    said third and fourth pluralities of ferrite pieces are rectangularly shaped, and are arranged on said second dielectric disc so as to fan out radially from a center of said first dielectric disc toward an outer periphery thereof.

5. The apparatus of claim 4 wherein
    said first dielectric disc has a plurality of slots located at an outer periphery thereof,
    said second dielectric disc has a plurality of slots located at an outer periphery thereof; and
    said fifth plurality of ferrite pieces extend through said slots to connect the respective ones of the first and second pluralities of ferrite pieces to the third and fourth pluralities of ferrite pieces at the outer peripheries of the first and second dielectric discs.

6. The apparatus of claim 1 wherein
    said first and second pluralities of ferrite pieces extend outwardly from a central portion of said first dielectric disc to an outer periphery thereof,
    said third and fourth pluralities of ferrite pieces extend outwardly from a central portion of said first dielectric disc to an outer periphery thereof, and
    said fifth plurality of ferrite pieces connect respective ones of the first and second pluralities of ferrite pieces to the third and fourth pluralities of ferrite pieces at the outer peripheries of said first and second dielectric discs.

7. The apparatus of claim 1 wherein said first through fifth pluralities of ferrite pieces comprise ferrites selected from the group consisting of manganese-zinc, nickel-zinc, and magnesium-zinc ferrites.

8. The apparatus of claim 7 wherein said first through fourth pluralities of ferrite pieces comprise ferrites selected from the group consisting of manganese-zinc and magnesium-zinc ferrites, and said fifth plurality of ferrite pieces comprise nickel-zinc ferrites.

9. The apparatus of claim 1 further comprising two disc-shaped ferrite pieces, one of said disc-shaped ferrite pieces arranged at a center of said first dielectric disc so as to contact said first and second pluralities of ferrite pieces, and the other of said disc-shaped ferrite pieces arranged at a center of said second dielectric disc so as to contact said third and fourth pluralities of ferrite pieces.

10. The apparatus of claim 9 further comprising a sixth plurality of ferrite pieces to connect said two disc-shaped ferrite pieces toward respective centers of said first and second dielectric discs.

11. The apparatus of claim 9 wherein said two disc-shaped ferrite pieces comprise ferrites selected from the group consisting of manganese-zinc and magnesium-zinc ferrites.

12. The apparatus of claim 1 wherein said first and second coils comprise pancake coils.

13. The apparatus of claim 1 wherein said first and second dielectric discs have openings therein to facilitate laminar air flow.

14. The apparatus of claim 1 wherein said first and second dielectric discs comprise a material selected from the group consisting of polyetherimide (PEI) resin, polyetheretherketone, polytetrafluoroethylene (PTFE), and G7 and G10 versions of fiberglass.

15. The apparatus of claim 1 wherein said first coil is embedded inside said first dielectric disc and said second coil is embedded inside said second dielectric disc.

16. The apparatus of claim 1 wherein said first coil is attached to said first dielectric disc on a side opposite said first and second pluralities of ferrite pieces, and said second coil is attached to said second dielectric disc on a side opposite said third and fourth pluralities of ferrite pieces.

17. A method of providing isolated power to a component of a plasma processing chamber that also is subject to a plurality of RF signals, including at least a first RF signal having a first RF frequency, the method comprising:
providing first and second coils;
supporting the first and second coils with respective first and second dielectric discs; and
providing a ferrite cage that surrounds said first and second coils and the first and second dielectric discs, providing the ferrite cage comprising:
providing first and second pluralities of ferrite pieces on a side of said first dielectric disc facing away from said second dielectric disc;
providing third and fourth pluralities of ferrite pieces on a side of said second dielectric disc facing away from said first dielectric disc;
providing a fifth plurality of ferrite pieces to connect respective ones of the first and second pluralities of ferrite pieces to the third and fourth pluralities of ferrite pieces; and
said fifth plurality of ferrite pieces to separate said first and second dielectric discs so that the first and second coils are spaced apart by a predetermined distance.

18. The method of claim 17 further comprising
arranging the first and second pluralities of ferrite pieces on said first dielectric disc so as to fan out radially from a central portion of said first dielectric disc toward an outer periphery thereof, and
arranging said third and fourth pluralities of ferrite pieces on said second dielectric disc so as to fan out radially from a central portion of said first dielectric disc toward an outer periphery thereof.

19. The method of claim 18 further comprising
providing a plurality of slots on each of said first and second dielectric discs toward an outer periphery thereof, and
extending said fifth plurality of ferrite pieces through said slots to connect the respective ones of the first and second pluralities of ferrite pieces to the third and fourth pluralities of ferrite pieces.

20. The method of claim 18 further comprising
arranging said first and second pluralities of ferrite pieces to extend outwardly from a central portion of said first dielectric disc to an outer periphery thereof,
arranging said third and fourth pluralities of ferrite pieces to extend outwardly from a central portion of said first dielectric disc to an outer periphery thereof, and
arranging said fifth plurality of ferrite pieces to connect respective ones of the first and second pluralities of ferrite pieces to the third and fourth pluralities of ferrite pieces at the outer peripheries of said first and second dielectric discs.

21. The method of claim 17 further comprising
providing openings in each of said first and second dielectric discs to facilitate laminar air flow.

22. The method of claim 17 wherein providing said ferrite cage further comprises
arranging a first disc-shaped ferrite piece at a center of said first dielectric disc so as to contact said first and second pluralities of ferrite pieces, and arranging a second disc-shaped ferrite piece at a center of said second dielectric disc so as to contact said third and fourth pluralities of ferrite pieces.

23. The method of claim 22 further comprising providing a sixth plurality of ferrite pieces to connect the first and second disc-shaped ferrite pieces toward respective centers of said first and second dielectric discs.

* * * * *